(12) United States Patent
Peluso

(10) Patent No.: US 7,548,407 B2
(45) Date of Patent: Jun. 16, 2009

(54) CAPACITOR STRUCTURE

(75) Inventor: Vincenzo F. A. Peluso, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 327 days.

(21) Appl. No.: 11/404,471

(22) Filed: Apr. 13, 2006

(65) Prior Publication Data

US 2007/0058324 A1 Mar. 15, 2007

Related U.S. Application Data

(60) Provisional application No. 60/716,485, filed on Sep. 12, 2005.

(51) Int. Cl.
*H01G 4/005* (2006.01)
*H01G 4/06* (2006.01)
(52) U.S. Cl. ...................... 361/303; 361/311
(58) Field of Classification Search ......... 361/303–305, 361/311
See application file for complete search history.

(56) References Cited

U.S. PATENT DOCUMENTS

| | | | |
|---|---|---|---|
| 4,166,257 A | * | 8/1979 | Subramanian ............... 333/151 |
| 7,088,114 B2 | * | 8/2006 | Gozzini ...................... 324/663 |

| | | | |
|---|---|---|---|
| 2003/0124792 A1 | | 7/2003 | Jeon et al. |
| 2004/0036143 A1 | | 2/2004 | Hu et al. |
| 2004/0190219 A1 | | 9/2004 | Georgakos |

FOREIGN PATENT DOCUMENTS

| | | | |
|---|---|---|---|
| JP | 63086912 A | * | 4/1988 |
| WO | 0191144 A1 | | 11/2001 |

OTHER PUBLICATIONS

International Search report - PCT/US06/035603, International Search Authority - European Patent Office, Nov. 27, 2006.
Written Opinion - PCT/US06/035603, International Search Authority - European Patent Office, Nov. 27, 2006.
International Preliminary Report on Patentability - PCT/US06/035603, The International Bureau of WIPO - Geneva, Switzerland - Mar. 18, 2008.

* cited by examiner

*Primary Examiner*—Eric Thomas
(74) *Attorney, Agent, or Firm*—Jiayu Xu

(57) ABSTRACT

An integrated circuit capacitor structure includes a first wall that serves as a first terminal for each capacitor of a plurality of capacitors. The capacitor structure also includes a plurality of second walls, with each second wall serving as a second terminal for a different capacitor of the plurality of capacitors. The first wall and the second walls stand parallel to each other. In embodiments, the capacitor structure includes a substrate on which the first and the second walls stand perpendicularly. In embodiments, the first wall includes a plurality of first finger regions extending from a first common region of the first wall, and one or more of the first finger regions is at least partially positioned between different second walls.

17 Claims, 3 Drawing Sheets

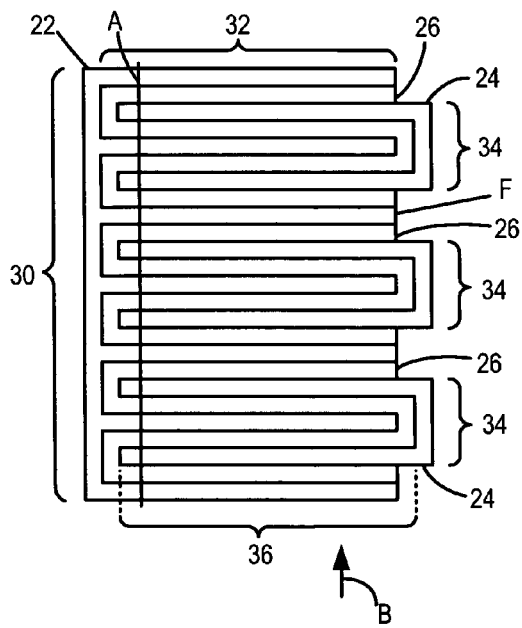
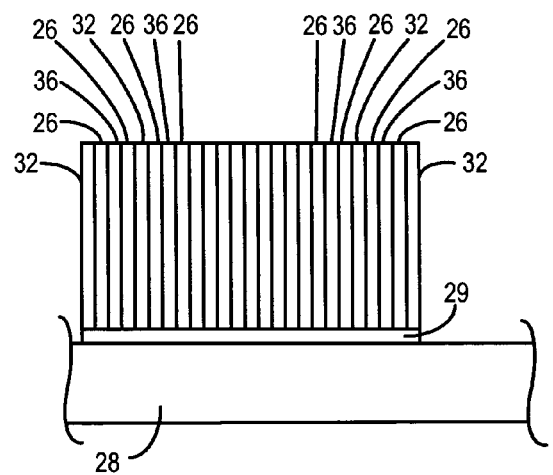
Figure 5
Figure 6
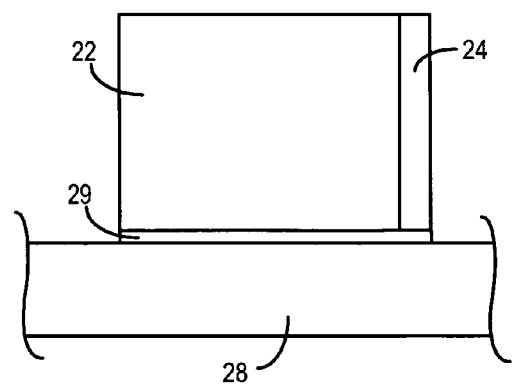
Figure 7

US 7,548,407 B2

CAPACITOR STRUCTURE

RELATED APPLICATIONS

This application claims the benefit of provisional U.S. application Ser. No. 60/716,485, entitled "LAYOUT OF A LINEAR CAPACITOR BANK," filed Sep. 12, 2005, assigned to the assignee of the present application, and incorporated herein by reference in its entirety for all purposes.

BACKGROUND

1. Field

The present invention generally relates to integrated circuit components and more specifically to capacitors.

2. Background

A variety of electrical applications make use of a capacitor structure having a plurality of capacitors that each has a first terminal and a second terminal. The capacitor structure also includes a common line connected to each of the first terminals such that the potential at each of the first terminals is about the same. The capacitor structure also includes a plurality of capacitor lines that are each connected to a different one of the second terminals such that the potential at each of the second terminals can be different. In integrated circuits, this capacitor structure can be implemented using vertical parallel plate capacitors. However, building the capacitor structure using vertical parallel plate capacitors can result in an undesirably high level of parasitic capacitance. As a result, there is a need for a reduction in the parasitic capacitance associated with the use of vertical parallel plate technology to implement the capacitor structure.

SUMMARY

A capacitor structure includes a first wall that serves as a first terminal for a plurality of capacitors. The capacitor structure also includes a plurality of second walls. Each second wall serves as the second terminal for a different one of the capacitors.

An embodiment of the capacitor structure includes a first wall that serves as a first terminal for a plurality of capacitors. The first wall has a plurality of first finger regions extending from a common region. The capacitor structure also includes plurality of second walls that each serves as a second terminal for a different one of the capacitors. The second walls each include a plurality of second finger regions extending from a common region. The second finger regions are substantially parallel to the first finger regions and are arranged such that one or more first finger regions are at least partially positioned between second finger regions from different second walls. The first wall and the second walls are perpendicular to a substrate.

BRIEF DESCRIPTION OF THE DRAWINGS

FIG. 2 is a topview of the capacitor structure. The capacitor structure includes a first wall that serves as a first terminal for a plurality of capacitors. The capacitor structure also includes a plurality of second walls that each serves as the second terminal for a different one of the capacitors.

FIG. 3 is a cross section of the capacitor structure shown in FIG. 2 taken along the line labeled A in FIG. 2.

FIG. 4 is a side-view of the capacitor structure shown in FIG. 2 taken looking in the direction of the arrow labeled B in FIG. 2.

FIG. 5 through FIG. 7 illustrate another embodiment of a capacitor structure that implements the circuit illustrated in FIG. 1. FIG. 5 is a topview of the capacitor structure.

FIG. 6 is a cross section of the capacitor structure shown in FIG. 5 taken along the line labeled A in FIG. 6.

FIG. 7 is a side-view of the capacitor structure shown in FIG. 5 taken looking in the direction of the arrow labeled B in FIG. 6.

DETAILED DESCRIPTION

A capacitor structure includes a first terminal that is common to a plurality of capacitors. The capacitor structure also includes a plurality of second terminals. Each of the second terminals is included in one of the capacitors. The capacitors can each be a vertical parallel plate capacitor. Accordingly, the first terminal can include or consist of a first wall and the second terminals can include or consist of a second wall. Since the first terminal is common to each of the capacitors instead of each capacitor including a first terminal, the total surface area of the first terminals is reduced. Reducing the surface area of the first terminals reduces the parasitic capacitance of the capacitor structure. As a result, the capacitor structure has a reduced parasitic capacity.

Figure 1:
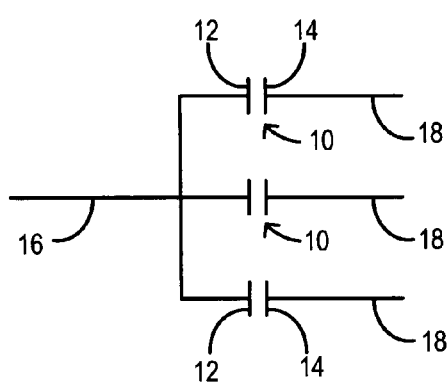
FIG. 1 is a schematic diagram for a circuit that is employed in a variety of electronic applications.

FIG. 1 is a schematic diagram for a circuit that is employed in a variety of electronic applications. The circuit includes a plurality of capacitors 10 that each includes a first terminal 12 and a second terminal 14. The first terminals 12 are each in electrical communication with a common line 16 such that the potential at each of the first terminals 12 is the same. The second terminals 14 are each connected to a different capacitor line 18 such that the potential on each of the second terminals 14 can be different.

Figure 2:
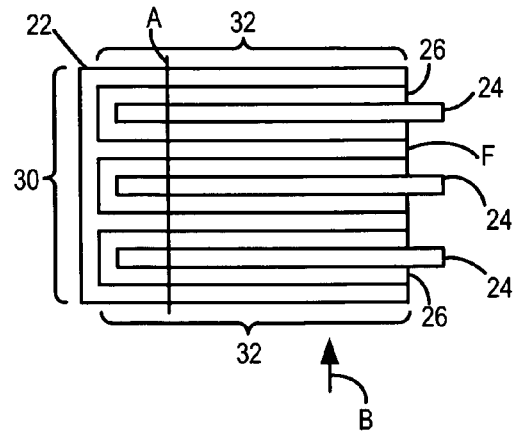
FIG. 2 through FIG. 4 illustrate a capacitor structure that implements the circuit illustrated in FIG. 1.
Figure 3:
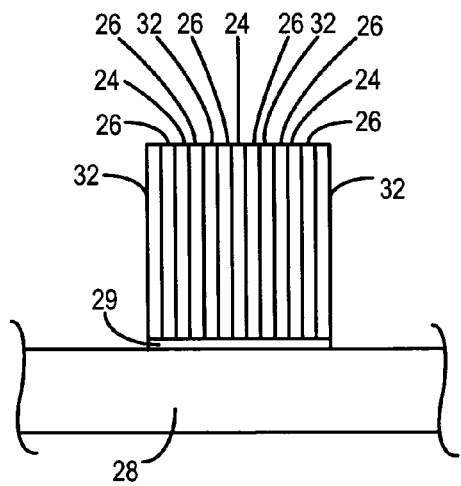
Figure 4:
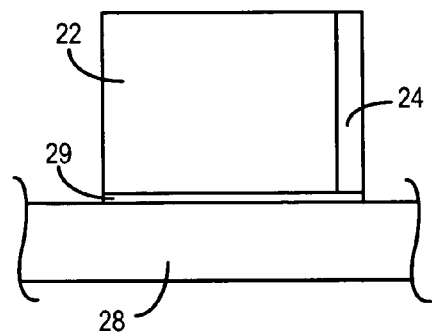

FIG. 2 through FIG. 4 illustrate a capacitor structure that implements the circuit illustrated in FIG. 1. FIG. 2 is a topview of the capacitor structure. FIG. 3 is a cross section of the capacitor structure shown in FIG. 2 taken along the line labeled A. FIG. 4 is a side-view of the capacitor structure shown in FIG. 2 taken looking in the direction of the arrow labeled B.

The capacitor structure includes a first wall 22 that is electrically conducting and serves as the first terminal 12 for each of the capacitors 10 illustrated in FIG. 1. The capacitor structure also includes a plurality of second walls 24 that are electrically conducting. Each of the second walls 24 serves as a second terminal 14 for one of the capacitors 10 illustrated in FIG. 1. A dielectric 26 such as an oxide is positioned between the first wall 22 and the second walls 24. Accordingly, a second wall 24, the associated portion of the first wall 22, and the associated dielectric 26 serve as one of the capacitors 10 illustrated in FIG. 1. Since the first wall 22 is common to each of the capacitors, the first wall 22 can also serve as the common line 16 in the circuit of FIG. 1. Additionally, since the second walls 24 are separate from one another, each second wall 24 can serve as a capacitor line 18 in the circuit of FIG. 1.

The first wall 22 and the second wall 24 are positioned on a substrate 28. The walls can be substantially perpendicular to the substrate 28. Accordingly, the walls are substantially vertical relative to the substrate. As a result, the capacitors can be vertical parallel plate capacitors. A suitable substrate 28 can include one or more layers of material. Although the first wall 22 and the second walls 24 are illustrated as being positioned directly on the substrate 28, additional materials can be positioned between the first wall 22 and the substrate 28 and/or between the second walls 24 and the substrate 28. For instance, FIG. 3 and FIG. 4 illustrate a layer of oxide 29 positioned between the substrate 28 and the first wall 22 and between the substrate and the second wall 24.

The first wall 22 includes a first common region 30 and a plurality of first finger regions 32 extending from the first common region 30. The first finger regions 32 are substantially parallel with the second walls 24. Each of the second walls 24 is at least partially positioned between first finger regions 32 and at least some of the first finger regions 32 are at least partially positioned between second walls 24. Accordingly, the first finger regions 32 and the second walls 24 are arranged in a row, stack or column with first finger regions 32 alternated with the second walls 24 as is evident from the cross section shown in FIG. 3. As an alternate to the illustrated arrangement of first finger regions 32 and second walls 24, the first finger regions 32 and second walls 24 can be arranged such that some of the second walls 24 are at least partially positioned between first finger regions 32 while each of the first finger regions 32 or at least some of the first finger regions 32 are at least partially positioned between second walls 24.

At least one of the first finger regions 32 is positioned between different second walls 24. For instance, the first finger region 32 labeled F is positioned between two different second walls 24. Additionally, no more than one first finger region 32 is positioned between adjacent second walls 24 where an adjacent pair of second walls 24 is a pair of second walls 24 arranged such that no other second walls 24 are positioned between the second walls 24 included in the adjacent pair of second walls 24.

At least a portion of one or more second walls is received in a pocket defined by the first common region and two first finger regions. The shortest distance between a first common region and a second wall can be greater than or equal to the shortest distance between a second wall and the nearest first finger region. Additionally or alternately, when a first finger regions 32 is positioned between adjacent second walls 24, the shortest distance between the first finger region and each of the second walls can be the same or different.

FIG. 5 through FIG. 7 illustrate another embodiment of a capacitor structure that implements the circuit illustrated in FIG. 1. FIG. 5 is a topview of the capacitor structure. FIG. 6 is a cross section of the capacitor structure shown in FIG. 5 taken along the line labeled A. FIG. 7 is a side-view of the capacitor structure shown in FIG. 5 taken looking in the direction of the arrow labeled B.

The capacitor structure includes a first wall 22 that is electrically conducting and serves as the first terminal 12 for each of the capacitors 10 illustrated in FIG. 1. The capacitor structure also includes a plurality of second walls 24 that are electrically conducting. Each of the second walls 24 serves as a second terminal 14 for one of the capacitors 10 illustrated in FIG. 1. A dielectric 26 such as an oxide is positioned between the first wall 22 and the second walls 24. Accordingly, a second wall 24, the associated portion of the first wall 22, and the associated dielectric 26 serve as one of the capacitors 10 illustrated in FIG. 1. Since the first wall 22 is common to each of the capacitors, the first wall 22 can serve as the common line 16 in the circuit of FIG. 1 in addition to serving as the first terminal for each of the capacitors. Additionally, since the second walls 24 are separate from one another, each second wall 24 can serve as a capacitor line 18 in the circuit of FIG. 1.

The first wall 22 and the second wall 24 are positioned on a substrate 28. The walls can be substantially perpendicular to the substrate 28. As a result, the walls are substantially vertical relative to the substrate. Accordingly, the capacitors can be vertical parallel plate capacitors. A suitable substrate 28 can include one or more layers of material. Although the first wall 22 and the second walls 24 are illustrated as being positioned directly on the substrate 28, additional materials can be positioned between the first wall 22 and the substrate 28 and/or between the second walls 24 and the substrate 28. For instance, FIG. 6 and FIG. 7 illustrate a layer of oxide 29 positioned between the substrate 28 and the first wall 22 and between the substrate and the second wall.

The first wall 22 includes a first common region 30 and a plurality of first finger regions 32 extending from the first common region 30. The second wall 24 includes a second common region 34 and a plurality of second finger regions 36 extending from the second common region 34. The first finger regions 32 are substantially parallel with the second finger regions 36. Each of the second finger regions 36 is at least partially positioned between first finger regions 32 and at least some of the first finger regions 32 are at least partially positioned between second finger regions 36. Accordingly, the first finger regions 32 and the second finger regions 36 are arranged in a row, stack or column with first finger regions 32 alternated with the second finger regions 36 as is evident from the cross section shown in FIG. 6. In this arrangement, the number of first finger regions 32 in the capacitor structure can equal the number of second finger regions 36 plus one. As an alternate to the illustrated arrangement of first finger regions 32 and second walls 24, the first finger regions 32 and second walls 24 can be arranged such that some of the second walls 24 are at least partially positioned between first finger regions 32 while each of the first finger regions 32 or some of the first finger regions 32 is/are at least partially positioned between second walls 24. Accordingly, the number of second finger regions 36 in the capacitor structure can equal the number of first finger regions 32 plus one.

At least one of the first finger regions 32 is positioned between second finger regions 36 from different second walls 24. For instance, the first finger region 32 labeled F is positioned between the second finger regions 36 from different second walls 24. Additionally, no more than one first finger region 32 is positioned between the adjacent second finger regions 36 from different second walls 24 where an adjacent pair of second finger regions 36 is a pair of second finger regions 36 arranged such that no other second finger regions 36 are positioned between the second finger regions 36 included in the adjacent pair of second finger regions 36.

At least a portion of at least one of the second finger regions is received in a pocket defined by the first common region and two first finger regions. The shortest distance between a first common region and a second finger region can be greater than or equal to the shortest distance between the second finger region and the nearest first finger region. When a first finger regions 32 is positioned between adjacent second finger regions, the shortest distance between the first finger region and second finger regions can be the same or different.

Figure 8:
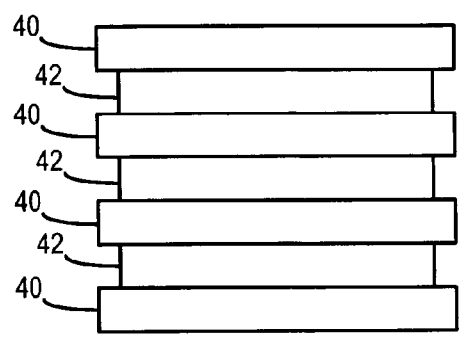
FIG. 8 is a sideview of a wall that is suitable for use in the capacitor structure.
Figure 9:
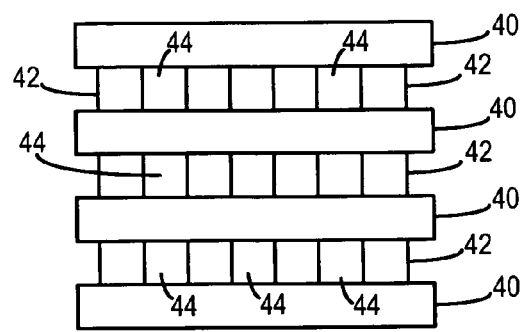
FIG. 9 is a sideview of another embodiment of a wall that is suitable for use in the capacitor structure.

The first walls 22 and the second walls 24 illustrated in FIG. 2 through FIG. 7 are shown as being constructed of a continuous electrically conducting medium. FIG. 8 is a side view of a wall having a construction that is an alternate to the construction of the first walls 22 and/or the second walls 24 shown in FIG. 2 through FIG. 7. The wall includes a plurality of conducting layers that are constructed of an electrically conducting medium 40. Vias 42 provide electrical communication between the conducting layers. A single via 42 can be positioned between adjacent conducting layers as illustrated in FIG. 8. Alternately, a plurality of vias 42 can be positioned between adjacent conducting layers as illustrated in FIG. 9. The intervening material 44 between the vias 42 can be the same as the dielectric.

Suitable conducting media include, but are not limited to, electrically conducting metals such as copper and aluminum. A suitable dielectric includes, but is not limited to, an oxide.

The capacitor structure can be generated using conventional integrated circuit manufacturing technologies.

Although the circuit and capacitor structures are shown above as including three capacitors, the circuit and capacitor structures can be scaled to include additional capacitors or fewer capacitors. For instance, the circuit and capacitor structures can include as few as two capacitors or more than three capacitors. Additionally or alternatively, different capacitors in the capacitor structure can be different. For instance, different capacitors can have different numbers of second finger regions. As an example, different second common regions in the capacitor structure can be connected to different numbers of second finger regions.

Although the finger regions of the first wall and the second wall are shown above as extending from a single side of a common region, the first wall and/or the second wall can have finger regions extending from different sides of a common wall.

Although the dielectric is illustrated as being positioned exclusively between the first wall and the second walls, the dielectric can be positioned in other locations in the capacitor structure. For instance, the dielectric can be positioned on the outside of one or more walls of the capacitor structure.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A capacitor structure, comprising:
    a first wall configured to serve as a first terminal that is common to a plurality of capacitors; and
    a plurality of second walls, each second wall of the plurality of second walls being configured to serve as a second terminals for a different one of the capacitors;
    wherein the first wall and the plurality of second walls stand substantially perpendicularly relative to a plane, height of the first wall in a dimension perpendicular to the plane is greater than thickness of the first wall in a dimension lying in the plane, and height of each second wall of the plurality of second walls in the dimension perpendicular to the plane is greater than thickness of said each second wall in the dimension lying in the plane.

2. The structure of claim 1, further comprising a substrate in the plane.

3. The structure of claim 1, wherein at least a portion of the first wall is positioned between a first one of the second walls and a second one of the second walls, the first one of the second walls being different from the second one of the second walls.

4. The structure of claim 1, wherein the first wall includes a first common region and a plurality of first finger regions extending from the first common region, at least one of the plurality of first finger regions being at least partially positioned between a first one of the second walls and a second one of the second walls, the first one of the second walls being different from the second one of the second walls.

5. The structure of claim 1, wherein the first wall includes a plurality of first finger regions extending from a first common region and said each second wall includes a second common region and a plurality of second finger regions extending from the second common region, and
    wherein one or more of the first finger regions are at least partially positioned between a second finger region from a first one of the second walls and a second finger region from a second one of the second walls, the first one of the second walls being different from the second one of the second walls.

6. The structure of claim 5, wherein the number of first finger regions is one more than the number of second finger regions.

7. The structure of claim 5, wherein the first finger regions are substantially parallel to the second finger regions.

8. The structure of claim 5, wherein no more than one first finger region is positioned between any adjacent pair of second finger regions, each adjacent pair of second finger regions being arranged such that no other second finger region is positioned between the second finger regions included in the adjacent pair of second finger regions.

9. The structure of claim 8, wherein the first finger regions are alternated with the second finger regions.

10. The structure of claim 1, wherein the first wall includes a first common region and a plurality of first finger regions extending from the first common region, and at least a portion of at least one of the second walls is received within a pocket defined by the first common region and two of the first finger regions.

11. A capacitor structure, comprising:
    a first wall configured to serve as a first terminal that is common to a plurality of capacitors; and
    a plurality of second walls, each second wall of the plurality of second walls being configured to serve as a second terminal for a different one of the capacitors;
    wherein
    the first wall includes a plurality of first conducting layers and one or more vias to provide electrical communication between the conducting layers, and
    the second wall includes a plurality of conducting layers and one or more vias provide electrical communication between the second conducting layers.

12. A capacitor structure, comprising:
    a first wall serving as a first terminal for a plurality of capacitors, the first wall being perpendicular to a substrate and having a plurality of first finger regions extending from a common region of the first wall; and
    a plurality of second walls, each of the plurality of second walls serving as a second terminal for a different one of the capacitors, said each of the second walls being perpendicular to the substrate and said each of the second walls including a common region of said each of the second walls and a plurality of second finger regions extending from said common region of said each of the second walls, the second finger regions being substantially parallel to the first finger regions and being arranged such that one or more of the first finger regions are at least partially positioned between a second finger region from a first one of the second walls and a second finger region from a second one of the second walls, the first one of the second walls being different from the second one of the second walls;

wherein height of the first wall in a dimension perpendicular to plane of the substrate is greater than thickness of the first wall in a dimension lying in the plane, and height of each second wall of the plurality of second walls in the dimension perpendicular to the plane is greater than thickness of said each second wall in the dimension lying in the plane.

13. The structure of claim 12, wherein the first finger regions and the second finger regions are arranged such that the first finger regions alternate with the second finger regions and no more than one first finger region is positioned between any adjacent pair of second finger regions, each adjacent pair of second finger regions being arranged such that no other second finger regions are positioned between the second finger regions included in the adjacent pair of second finger regions.

14. A capacitor structure, comprising:
  a first wall means for providing a first terminal that is common to a plurality of capacitors; and
  a plurality of second wall means for providing second terminals for a different one of the capacitors;
  wherein the first wall means and the plurality of second wall means stand substantially perpendicularly relative to a plane, height of the first wall means in a dimension perpendicular to the plane is greater than thickness of the first wall means in a dimension lying in the plane, and height of each second wall means of the plurality of second wall means in the dimension perpendicular to the plane is greater than thickness of said each second wall means in the dimension lying in the plane.

15. The structure of claim 14, further comprising a substrate in the plane.

16. The structure of claim 14, wherein at least a portion of the first wall means is positioned between a first one of the second wall means and a second one of the second wall means, the first one of the second wall means being different from the second one of the second wall means.

17. A capacitor structure, comprising:
  a first wall means for providing a first terminal that is common to a plurality of capacitors; and
  a plurality of second wall means for providing second terminals for a different one of the capacitors;
  wherein
  the first wall means comprises a plurality of first conducting layer means for conducting and one or more via means for providing electrical communication between the conducting layer means, and
  the second wall means comprises a plurality of conducting layer means for conducting and one or more via means for providing electrical communication between the second conducting layer means.

* * * * *